(12) United States Patent
Miller

(10) Patent No.: US 6,311,138 B2
(45) Date of Patent: Oct. 30, 2001

(54) DIGITAL STORAGE OSCILLOSCOPE WITH SIMULTANEOUS PRIMARY MEASUREMENT AND DERIVED PARAMETER DISPLAY ON COMMON TIME AXIS AND METHOD THEREFOR

(75) Inventor: Martin T. Miller, Geneva (CH)

(73) Assignee: LeCroy, S.A. (CH)

( * ) Notice: Subject to any disclaimer, the term of this patent is extended or adjusted under 35 U.S.C. 154(b) by 0 days.

(21) Appl. No.: 09/752,949

(22) Filed: Jan. 2, 2001

Related U.S. Application Data

(63) Continuation of application No. 09/037,155, filed on Mar. 9, 1998, now Pat. No. 6,195,617.

(51) Int. Cl.[7] .................................................. G09G 5/36
(52) U.S. Cl. ............................................. 702/67; 702/125
(58) Field of Search .................... 702/67, 125; 345/134, 345/440; 324/329; 701/102, 29; 73/116

(56) References Cited

U.S. PATENT DOCUMENTS

| | | | | |
|---|---|---|---|---|
| 4,149,044 | * | 4/1979 | Hekimian et al. | 179/175.3 |
| 4,719,416 | * | 1/1988 | Desuatels | 324/121 R |
| 5,111,191 | * | 5/1992 | Povenmire | 340/720 |
| 5,375,067 | * | 12/1994 | Berchin | 702/67 |
| 5,446,650 | * | 8/1995 | Overhage et al. | 364/487 |

FOREIGN PATENT DOCUMENTS

| | | | |
|---|---|---|---|
| 0 477 507 A2 | 4/1992 | (EP) | F02P/17/00 |
| 03291570 | 12/1991 | (JP) | G01R/13/20 |

OTHER PUBLICATIONS

"Electric Counter—Modulation Domain Analyzer Applications," *Hewlett Packard Test and Measurement Catalog*, Internet URL www.hp.com/go/tmc98, pp. 121–125 (1998).

M. Lauterbach, "Getting Answers from LeCroy DSOs," http://www.lecroy.com/tm/benefits/answers/getanswers.html, pp. 1–7 (Mar. 3, 1998).

M. Agoston et al., "Using Digitizing signal Analyzers for Frequency Domain Analysis," *Microwave Journal*, 33, No. 9, pp. 181–189 (Sep., 1990).

"A Modulation–Domain Analyzer," *Microwave Journal*, 34, No. 1, pp. 169, 171 (Jan., 1991).

J. Novellino, "DSP Widens Spectrum Analyzers' Horizons," *Electronic Design*, 43, No. 8, pp. 155–156, 158 (Apr. 17, 1995).

"The Next Step in Real–Time FFT Spectral Analysis PC Workstations," *Sound Technology Instrument and Automation*, 2 pages (1996).

"Test and Measurement Industrial Automation," *Instrumentation Reference and Catalogue, National Instruments*, 2–9, 1997.

* cited by examiner

*Primary Examiner*—Marc S. Hoff
*Assistant Examiner*—Edward Raymond
(74) *Attorney, Agent, or Firm*—Hamilton, Brook, Smith & Reynolds, P.C.

(57) ABSTRACT

A method for presenting information and a digital storage oscilloscope are disclosed in which primary measurements of a signal are performed and displayed. Parameters are also derived for the signal based upon the primary measurement data. These derived parameters are then also displayed as a function of time on the display, preferably with a common time axis. This enables the oscilloscope operator to correlate features found by reference to the derived parameters directly to the primary measurements of the signal. Moreover, since the data from the primary measurements are stored in the oscilloscope, multi parameter calculation and parameter recalculation can be performed.

36 Claims, 10 Drawing Sheets

DIGITAL STORAGE OSCILLOSCOPE WITH SIMULTANEOUS PRIMARY MEASUREMENT AND DERIVED PARAMETER DISPLAY ON COMMON TIME AXIS AND METHOD THEREFOR

RELATED APPLICATION

This application is a continuation of application Ser. No. 09/037,155 filed Mar. 9, 1998, now U.S. Pat. No. 6,195,617. The entire teachings of the above application are incorporated herein by reference.

BACKGROUND OF THE INVENTION

Oscilloscopes are one of the more common examples of electrical test and measurement equipment. This class of devices makes primary measurements of time varying signals. In most instances, these measurements are of the signal's voltage as a function of time, even though the detected voltage may be indicative of some other measurement of interest such as electrical current through a resistive element or temperature in the case of a thermistor, in two arbitrary examples. The oscilloscope is useful because it enables the visualization of the time varying character of signals, using a vertical axis representing level and horizontal axis representing time.

The digital storage oscilloscope (DSO) is a subclass of oscilloscopes in which the time varying nature of the sampled signals is represented digitally within the device. The main advantage is that non-simultaneous signal events can be stored in the device for subsequent comparison. Additionally, parameters can be derived from the digital data of the primary measurements, such as statistical features of the signals.

In the typical implementation, the DSO works by waiting for the satisfaction of some trigger condition. When the trigger event is received, the primary measurements of the voltage, for example, of the signal are made, and the resulting measurement data are stored in a waveform memory. Successive positions in the waveform memory hold the digitized level of the signal at increasing time delays from the triggering event. Under current technology, DSOs can capture signals at a rate of up to 8 gigasamples/second (GS/s) with waveform memories of up to 16 million storage locations.

Where oscilloscopes are time domain instruments, spectrum analyzers make primary measurements in the frequency domain. In the typical configuration, these devices plot the magnitude of the signal energy as a function of frequency-signal magnitude or level being on the vertical axis with the frequency on the horizontal axis. These devices typically operate by scanning a very narrow notch-bandpass filter across the frequency spectrum of interest and measuring energy in the frequency bins. In this way, spectrum analyzers are useful in identifying the spectral distribution of a given signal.

For certain signal analysis problems, however, oscilloscopes and spectrum analyzers are not well suited to the task. For example, when trying to isolate infrequent anomalies in a signal such as that required for digital/analog circuit analysis/debugging or when trying to identify trends in signals such as when analyzing modulated signals, both oscilloscopes and spectrum analyzers are less useful. Since spectrum analyzers operate by scanning filters across the spectrum, any short term changes in the signals are lost; and in most oscilloscopes, such infrequent anomalies will scroll by on the display at a rate that is too fast for the operator to analyze. Only DSOs retain the relevant information on the signals, but in order to analyze it, the operator must scan through long arrays of data to find events that may not be readily apparent from the primary measurements alone.

In order to fill this gap, electronic counters such as modulation domain analyzers have been developed. These devices operate by performing primary measurements of the signal, i.e., detecting the signal's crossing time of a set threshold, and then generating plots of parameters derived from the primary measurements, such as the signal's frequency, phase, or time interval as a function of time. For example, the frequency/phase versus time analysis are very useful in analyzing frequency-shift-key and phase-shift-key, respectively, modulated transmissions; time interval analysis is useful for analyzing pulse-width modulated signals.

SUMMARY OF THE INVENTION

While being somewhat useful in analyzing obvious, recurrent trends in modulated signal transmission applications, modulation analyzers are less useful in identifying and tracing specific anomalies in those signals and addressing the wide range of signal analysis that would be desired. Modulation domain analyzers do not enable the operator to compare the derived parameters such as frequency/phase to the actual primary measurement of the signals such as its level, e.g., voltage. Modulation analyzers do not store the primary measurements, simply calculating the parameters on-the-fly. As a result, it is still difficult for the operator to find the highly infrequent anomalous event. Moreover, there is no way of identifying the location of the anomalous event in terms of the actual signal, even if it can be found. Still further, modulation domain analyzers require that the threshold be preset. Once a measurement is made, there is no way to select a different threshold. And, the number derived parameters that are offered by the devices is typically limited to phase, frequency, or time interval versus time.

The present invention concerns a digital oscilloscope that has been augmented with capabilities to derive and display parameters based on its primary measurements. In the preferred embodiment, the oscilloscope is a digital storage-type oscilloscope that measures a time varying voltage. The derived parameters are calculated from the primary measurements and simultaneously displayed with those measurements on the same time axis. This enables the oscilloscope operator to correlate features found by reference to the derived parameters directly to the primary measurements of the signal. Moreover, since the derived parameters are preferably calculated based upon stored data from the measurements, a large spectrum of different parameters can be calculated and different thresholds, for example, applied to the same data set.

In general, according to one aspect, the invention features a method for presenting information on a digital oscilloscope. The method comprises making primary measurements of a signal. In the typical instance, this comprises measuring the signal's voltage as a function of time, although the voltage can be indicative of some other time varying phenomenon, e.g., current, acceleration, or any transduced signal. The data from the primary measurement is then displayed as a function of time. In one typical implementation, the horizontal axis of the display represents time. According to the invention, parameters of the signal are also derived based upon the primary measurement data. These derived parameters are then also displayed as a function of time on the display. In the preferred implementation, the primary measurements and the derived parameters are displayed on a common display with a common time axis.

In specific embodiments, the derived time-varying parameters are generated based upon a number of operations. For example, the derived parameters can be generated by comparing the primary measurement data to a threshold. Such an operation yields parameters such as the time over which the primary measurement falls below or rises above a threshold as a function of time.

Additional features in further implementations derive parameters by first identifying cycles in the signal and then calculating the parameters for each of these cycles. Such operations are useful when, for example, plotting the time between minima/maxima and minima/maxima in previous or subsequent cycles, the time of local minima and/or maxima, period, per-cycle frequency, rise time, cycle fall time, over-shoot/pre-shoot, change in period, or change in pulse width from cycle-to-cycle.

In additional or alternative features, the derived parameters can be generated based upon first identifying cycles in the signal and then comparing the primary measurements in each cycle to a threshold. These operations are useful when determining peak-to-peak variation in amplitude, duty factor, and change in duty factor from cycle-to-cycle, for example.

In still further implementations, the derived parameters can be generated by first identifying cycles in the signal and then comparing each cycle to an absolute time reference. This is useful in communication systems to determine phase differences and timing errors. Similarly, the derived parameters can be generated by comparing the primary measurement data to a reference clock. This is useful for determining phase differences between the measured signal/clock and timing errors, for example.

In general, according to another aspect, the invention also features a method of operation for a digital oscilloscope. The method comprises repeatedly sampling and digitizing a signal at predetermined time intervals and storing the data generated by the digitization. Parameters are calculated from these primary measurements. The derived parameters are then displayed as a function of time on the oscilloscope. In this way, time-based parameters are calculated directly from the digital primary measurement data.

In general according to still another aspect, the invention features a digital oscilloscope. The oscilloscope comprises at least one digitization channel that performs primary measurements of a signal and generates data indicative of those measurements. A data processing unit is then used to derive parameters from the data. The primary measurement data and the derived parameters are then plotted as a function of time on the digital oscilloscope's display.

In specific embodiments, each digitization channel comprises a sample-and-hold circuit that freezes the signal. An analog-to-digital converter then digitizes the signal. The resulting data are stored in a waveform memory. Thereafter, the data from the waveform memory is transferred to a local memory unit. The data processing unit accesses this local memory to calculate the derived parameters that are stored back to the local memory after calculation.

In specific implementations, the local memory comprises arrays of storage locations. The data from the primary measurements and the derived parameters are stored in separate arrays but such that the processor can re-correlate the arrays to have an analogous temporal organization. In other words, the data processing unit can correlate derived parameters at specific locations with the data from the primary measurements that gave rise to the derived parameters. Preferably, the array holding the derived parameters is padded to facilitate scaling operations, such as zoom operations, performed for signal display.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

In the drawings, like reference characters refer to the same parts throughout the different views. The drawings are not necessarily to scale, emphasis instead being placed upon illustrating the principles of the invention. Of the drawings.

DETAILED DESCRIPTION OF THE INVENTION

A description of preferred embodiments of the invention follows.

Figure 1:
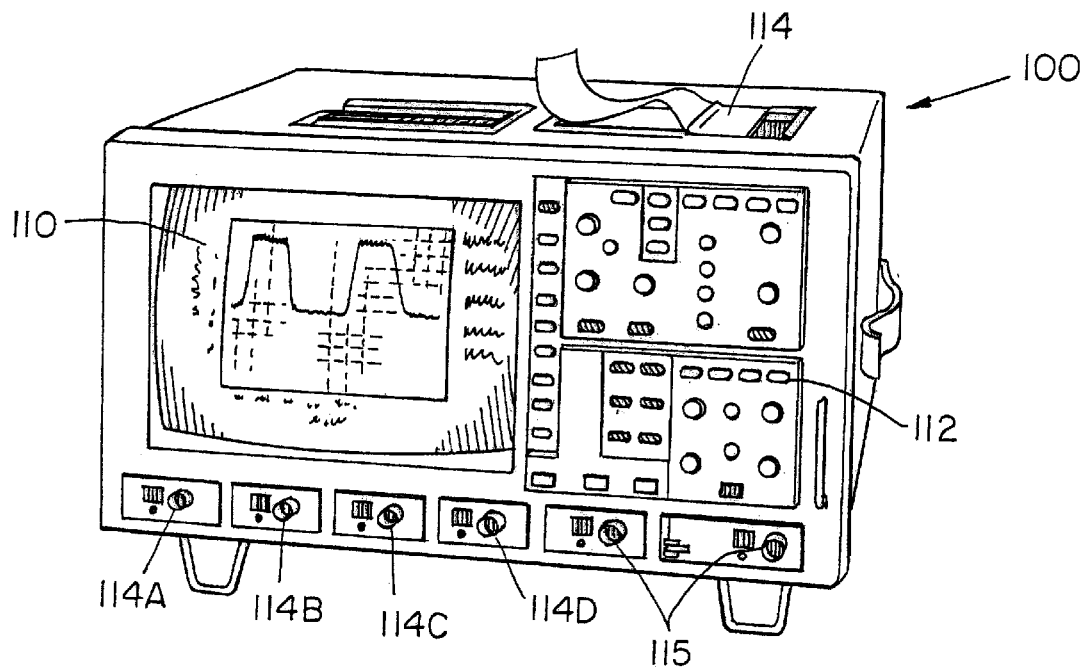
FIG. 1 is a perspective view of a digital storage oscilloscope.

FIG. 1 shows a digital storage oscilloscope (DSO) to which the principles of the present invention are applied. Generally, the DSO 100 comprises a display 110, on which the time-dependent data is displayed. A key pad 112 controls the operation of the display 110 and trigger characteristics, for example. An optional printer 114 provides a printout of the display, raw data, or the status of the oscilloscope. Four analog signal input ports 114A–114D connect to probes (not shown). The probes are used to transmit time varying voltage signals to the DSO 100 where they are sampled and digitized. Auxiliary input ports 115 provide alternative inputs or trigger inputs.

Figure 2:
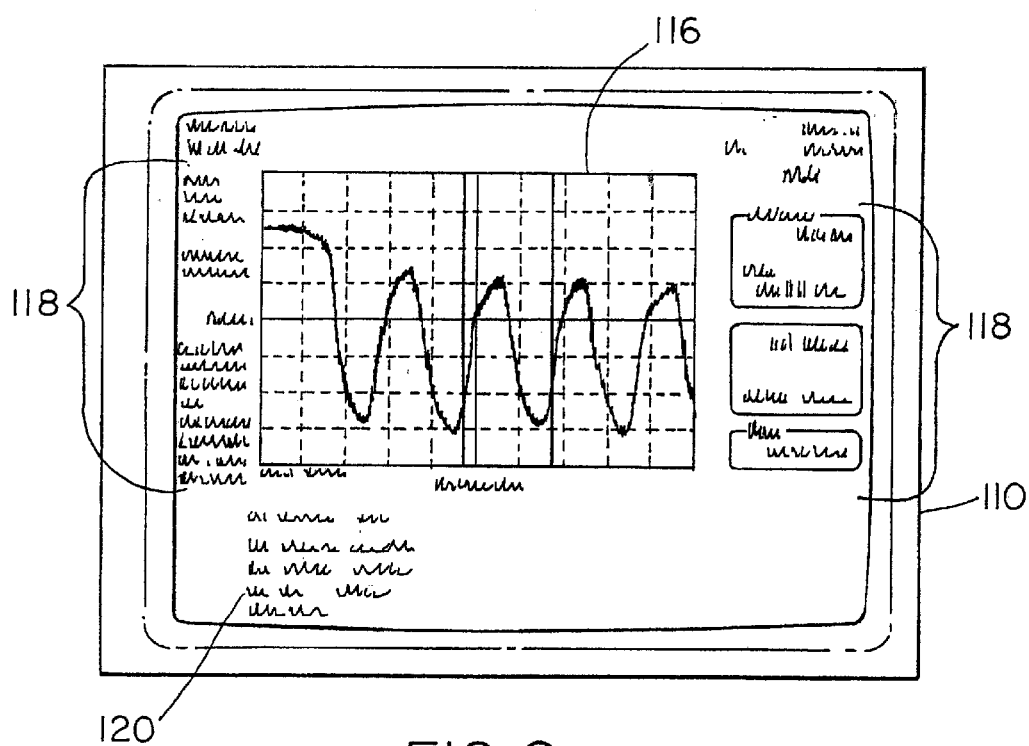
FIG. 2 shows a conventional display of a digital storage oscilloscope.

FIG. 2 is a detailed view of the display 110. It comprises a signal plot region 116 in which the detected voltage of a sampled signal is conventionally plotted on a vertical axis against an horizontal time axis. Status portions 118 of the display 110 identify the display characteristics, horizontal/vertical scale, and the oscilloscope's current settings. A legend region 120 identifies the mapping between the colors used in display and the plotted signals.

Figure 3:
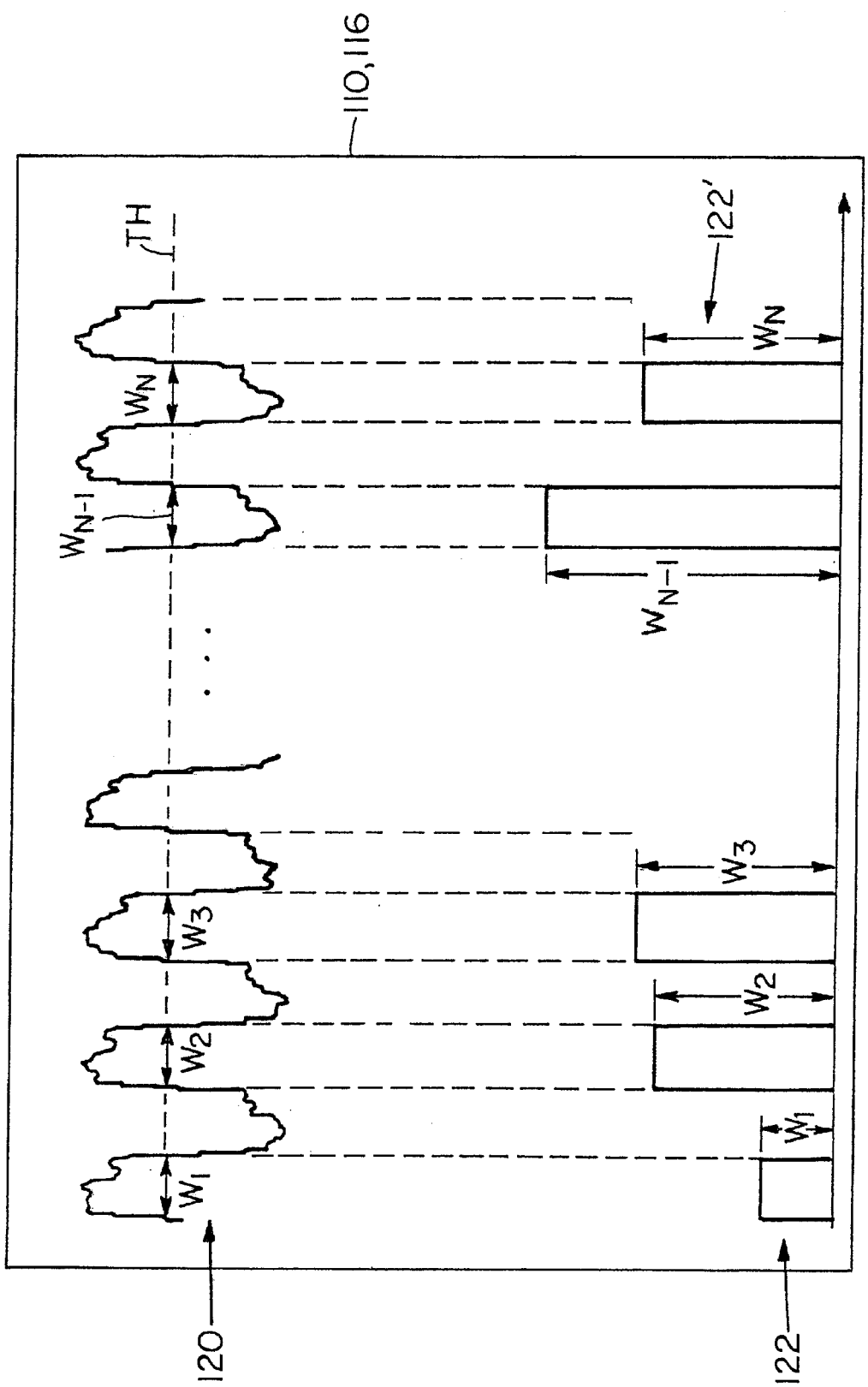
FIG. 3 is a schematic view of a digital oscilloscope display according to the present invention in which a pulse width jitter parameter display is generated.

FIG. 3 shows a display in which information is presented according to the principles of the present invention. The signal plot region 116 of display 110 has a primary measurement display portion 120 in which a primary measurement of the signal under analysis is displayed as in FIG. 2. In the most common example, the primary measurement display portion 120 will show the voltage level of the signal as a function of time on the horizontal axis. According to the invention, the signal plot region 116 of the display 110 also has a derived parameter display portion 122 in which parameters derived from the primary measurements are plotted, also as a function of time. In the preferred embodiment, the horizontal axis for the plotted primary measurement and the derived parameter are the same. This characteristic is illustrated by the dotted lines extending between the waveform of the primary measurement and the derived parameter plot. In this way the plots have a common time axis so that an operator, noticing an anomaly by reference to the derived parameter plot can trace the location of the event to the relevant segment of the primary measurement waveform.

In the illustrated example, the derived parameter is the time for which the data of the primary measurement either exceeds a threshold TH, illustrating width jitter. As a result, whereas the vertical axis in the primary measurement display portion 122 is voltage, the vertical axis in the derived parameter display portion 122 is time or signal width. As also illustrated, a closely related measurement is the time that the signal falls below the threshold TH. This alternative parameter plot is indicated by reference numeral 122'.

Figure 4:
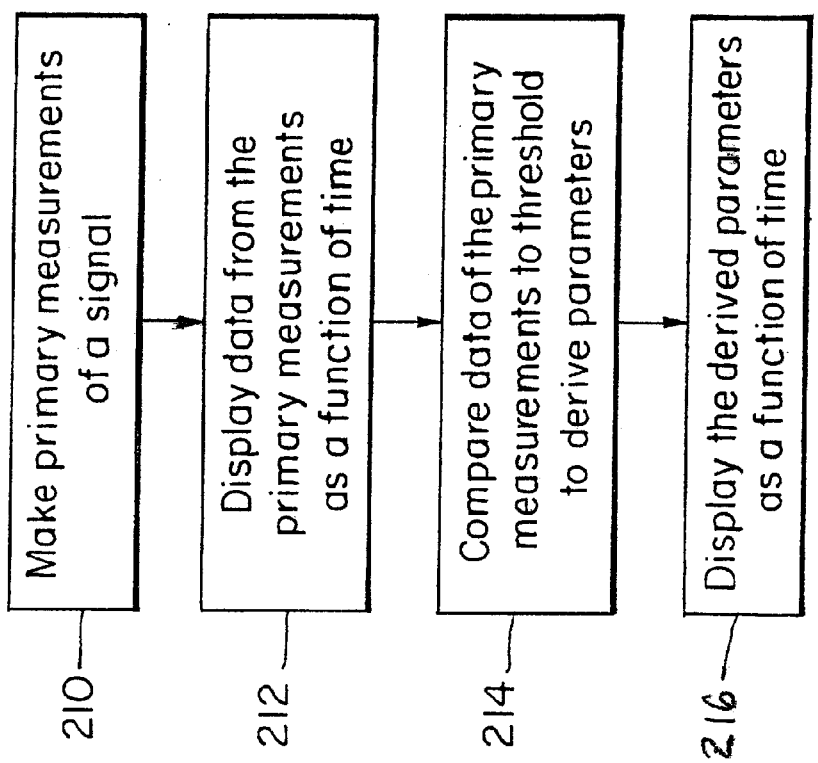
FIG. 4 is a process diagram illustrating the steps performed by the digital oscilloscope to generate threshold-based parameter displays.

FIG. 4 is a process diagram illustrating the method for generating the display of FIG. 3 in which the derived parameters are based upon the level of the primary measurements relative to some threshold. In the first step 210, the primary measurements are made of the signal. Then the data from the primary measurement is displayed as a function of time in step 212. This yields the primary measurement display portion 120. According to the invention, the data from the primary measurements are also compared to the threshold TH in step 214. The derived parameter, i.e., the length of time that the signal exceeds a threshold for every transition through the threshold TH, is also plotted in step 216, yielding the derived parameter display portion 122. The derived parameter display portion 122 preferably shares a time axis with the primary measurements. The vertical axis, however, represents the time the signal exceeds the threshold rather than voltage as in the primary measurement display portion 120.

Preferred embodiments, non-linear interpolation techniques are used such as (sin x)/x and cubic interpolation to enhance the accuracy by which threshold crossings are located in time. Additionally, the use of hysteresis values for threshold crossings and digital low pass filtering are also important to provide better noise immunity in the parameter calculations.

Figure 5:
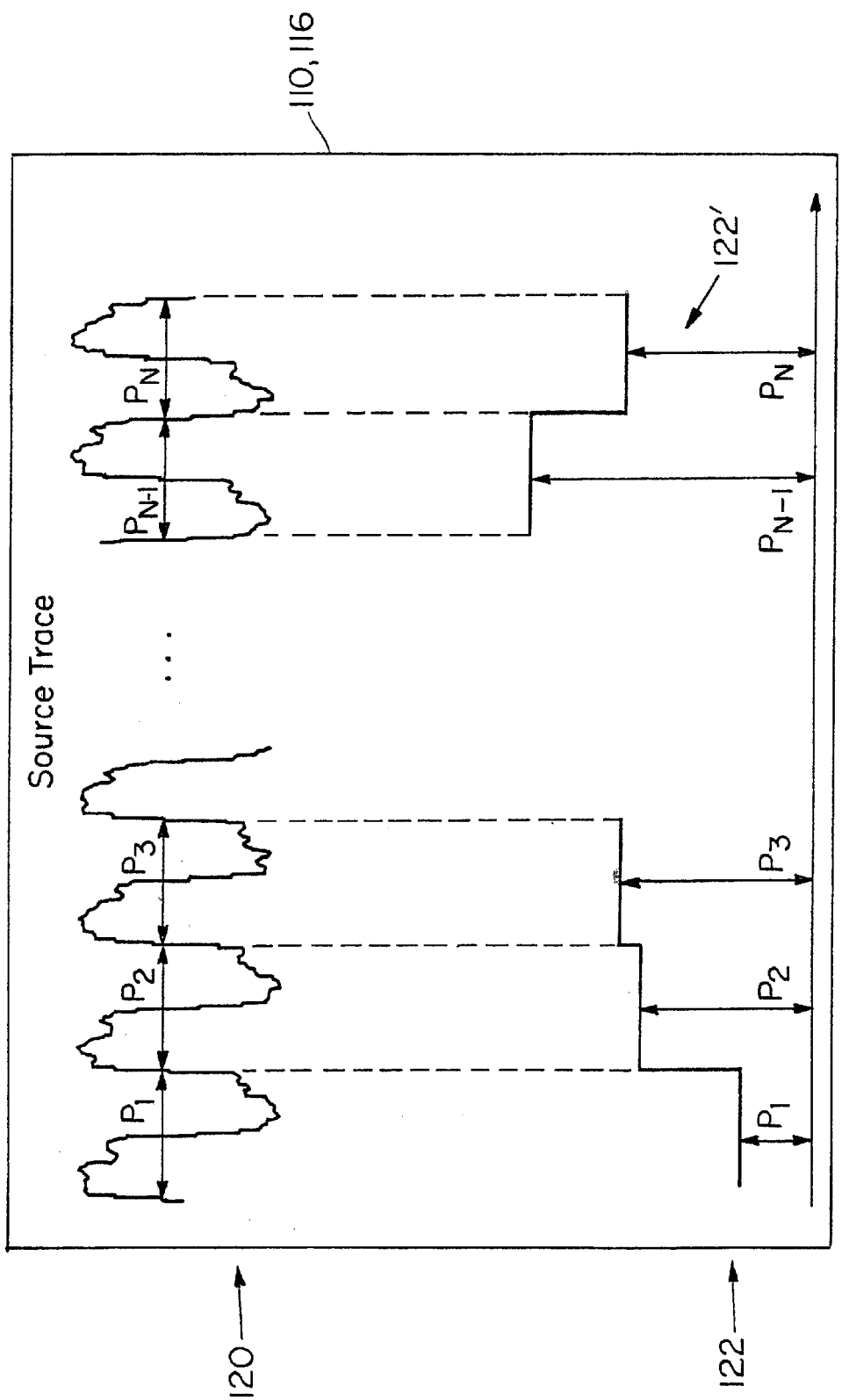
FIG. 5 is a schematic view of a digital oscilloscope display according to the present invention in which a period jitter parameter display is generated.

FIG. 5 shows another exemplary display of derived parameters with primary measurements, according to the present invention. In this case, as in FIG. 3, the primary measurement portion 120 of the display 110 shows the voltage of the signal as a function of time. The period of this signal, however, is derived from the data of the primary measurement. The derived parameter portion 122 of the display 122 then plots the period for each cycle of the signal. This display is helpful to show the progression of the period over time, allowing the operator to relate the plot of the period to the actual waveform of the primary measurement because of the common time axis. As illustrated by derived parameter display 122', in alternative or complimentary embodiments, the period can be derived beginning at the falling portion of the signal rather than the rising portion as shown in portion 122.

Figure 6:
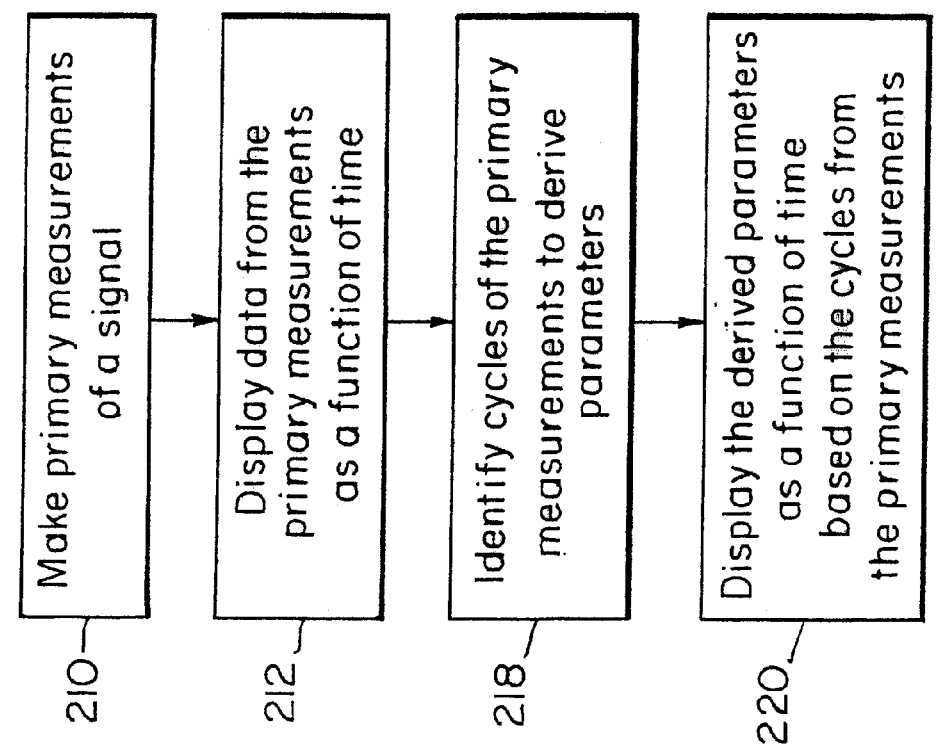
FIG. 6 is a process diagram illustrating the steps performed by the digital oscilloscope to generate cycle-based parameter displays.

FIG. 6 is a process diagram illustrating the method for generating the display 110 shown in FIG. 5. As discussed in reference to FIG. 4, the primary measurements of the signal are made and displayed in steps 210 and 212. According to the present process, cycles of the waveform of the primary measurements are then identified in step 218 by reference to the data from the primary measurements. Based upon the identification of the cycles and the data, derived parameters are calculated, i.e., the periods of successive cycles, and displayed as a function of time in step 220.

Figure 7:
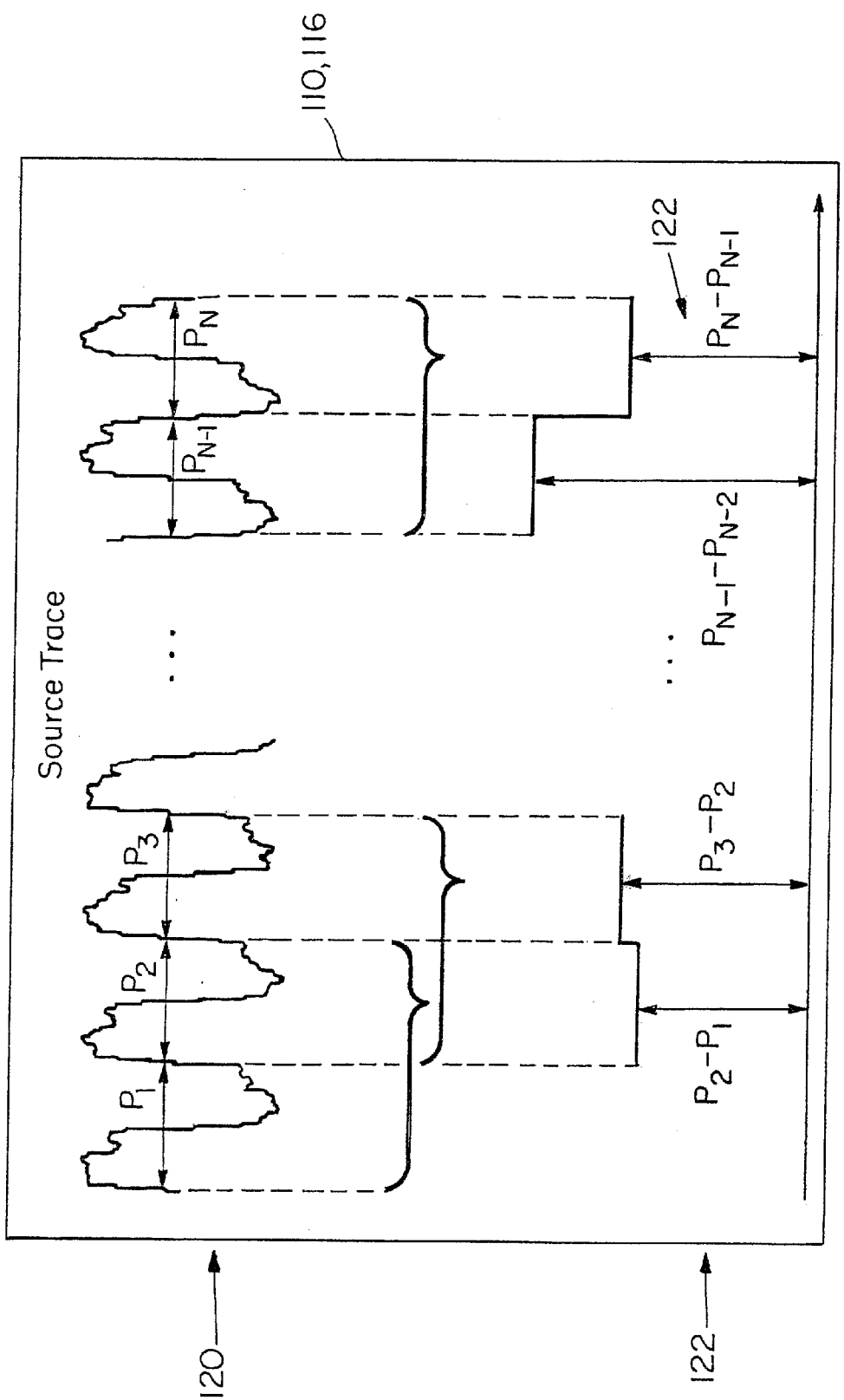
FIG. 7 is a schematic view of a digital oscilloscope display according to the present invention in which a cycle-to-cycle jitter parameter display is generated.

FIG. 7 shows another display 110 that is also based upon the cycles of the data from the primary measurements. In this case, the cycle-to-cycle jitter is plotted on the derived parameter portion 122 of the display 110. Specifically, the vertical axis of the derived parameter portion of the display 122 represents the difference between the current cycle period and the previous cycle period ($P_n - P_{n-1}$).

In alternative embodiments, the derived parameters are based on other cycle parameters such as: the time between the maxima and minima for each cycle, the time between minima and a previous minima for each cycle, the time of a local minima for each cycle, the time of a local maxima for each cycle, the time between local maxima and local minima for each cycle, the frequency of each cycle, the rise time for each cycle, the fall time for each cycle, the overshoot for each cycle, the pre-shoot for each cycle, and the change in pulse-width for each cycle relative to adjacent cycles.

Especially when searching for minima and maxima in the primary measurements to generate the parameters, the use of hysteresis values is a useful technique for locating the events of interest. Moreover, non-linear interpolation techniques are also preferably used such as (sin x)/x and cubic interpolation to enhance the accuracy by which peaks or other events are located in time and amplitude.

Figure 8:
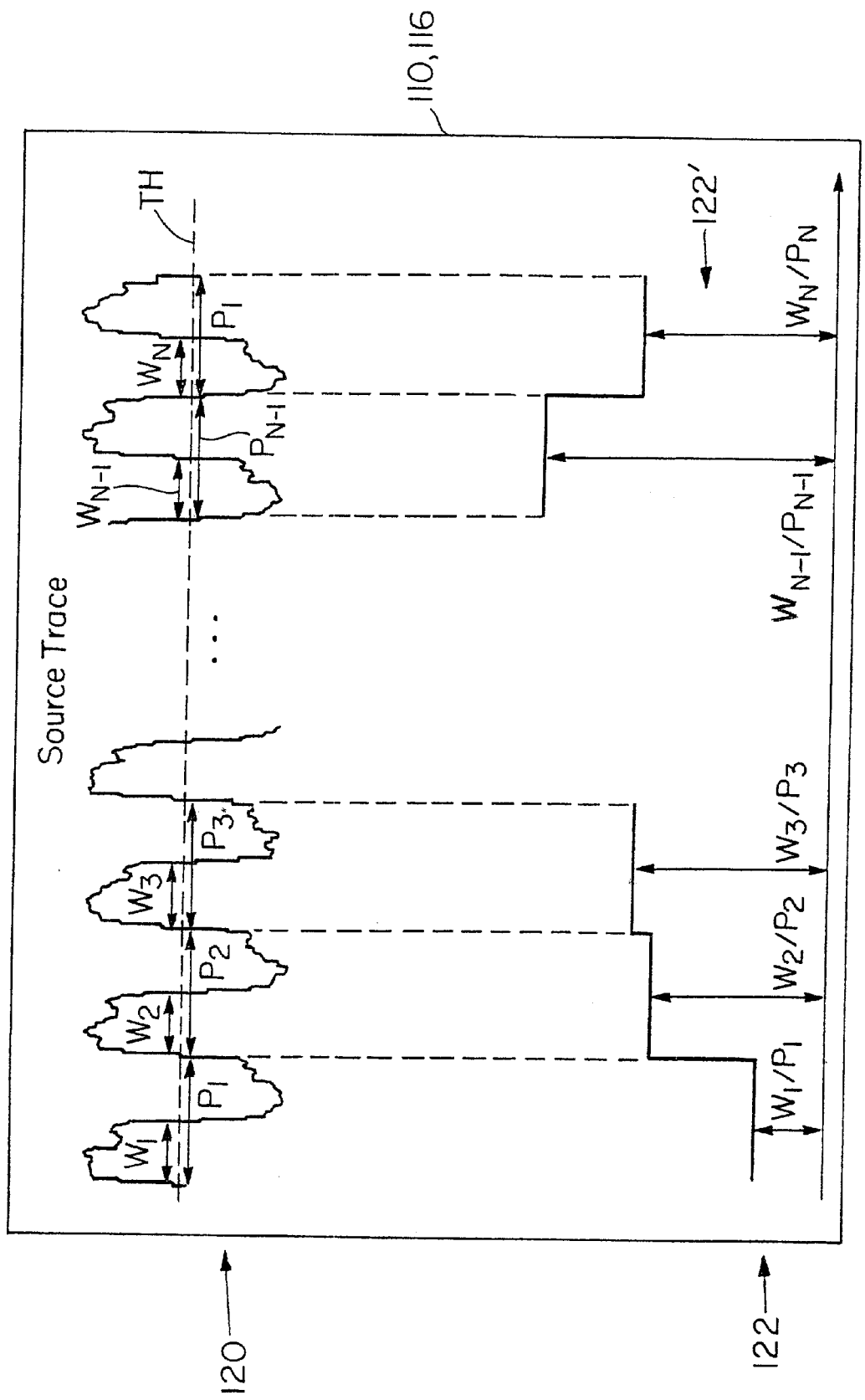
FIG. 8 is a schematic view of a digital oscilloscope display according to the present invention in which a duty cycle jitter parameter display is generated.

FIG. 8 shows still another display of a derived parameter plot with the primary measurement plot. In this example, the derived parameter is based upon the period of each cycle $P_n$ and the duty cycle width $W_N$ or the time for which the voltage of the signal exceeds some threshold TH. The plot of the derived parameters 122 has a vertical axis that is the duty cycle $W_N$ for a cycle divided by the period for that cycle $P_N$ The alternative derived parameter plot 122' illustrates that the parameters can also be based on the time each cycle is below the threshold TH.

Figure 9:
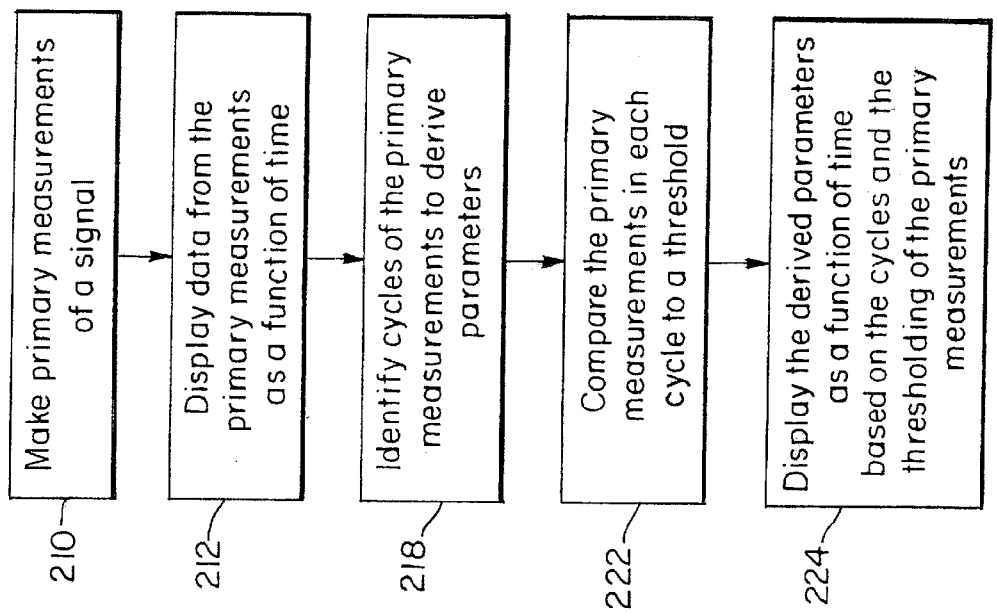
FIG. 9 is a process diagram illustrating the steps performed by the digital oscilloscope to generate threshold and cycle-based parameter displays.

FIG. 9 is a process diagram illustrating the technique for generating a cycle time and threshold-based derived parameter display. Specifically, as in FIG. 6, the primary measurements are made, the plot of the primary measurements is displayed, and the cycles of the primary measurements are identified in steps 210, 212, 218. In each cycle, the data from the primary measurements is also compared to a threshold TH in step 222. The parameters are then calculated and displayed as a function of time in step 224 based on the identified cycles in the signal and the thresholding of the data from the primary measurements.

In additional implementations, derived parameter displays based upon the peak variation in the amplitude and/or the duty factor are also plotted with the voltage of the primary measurements.

Figure 10:
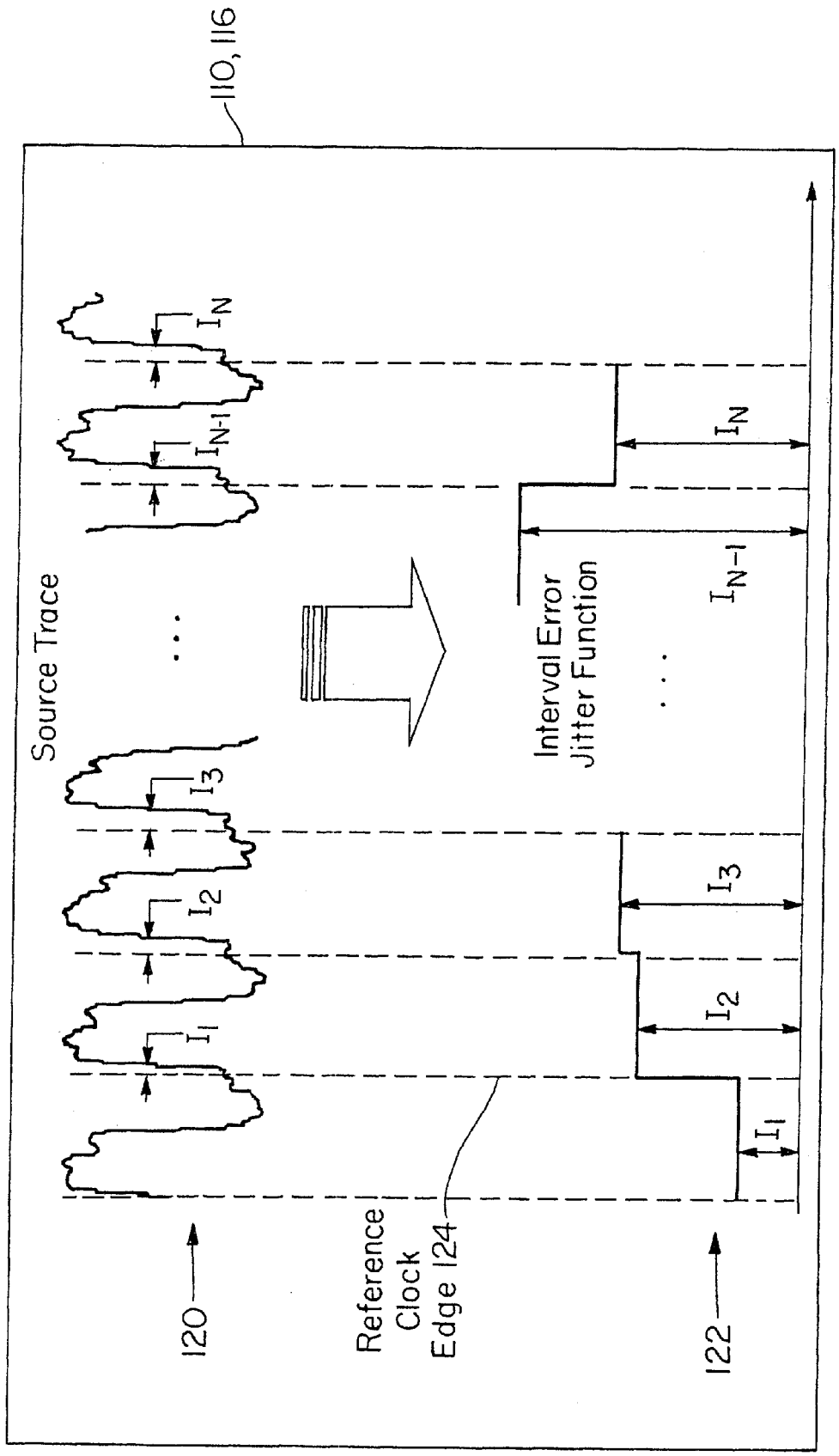
FIG. 10 is a schematic view of a digital oscilloscope display according to the present invention in which an interval error jitter parameter display is generated.

FIG. 10 shows still another embodiment of the plot portion 116 of display 110 according to the present invention. In this case the primary measurement portion of the display 120 plots the data from the primary measurements as a function of time as described previously. Cycles in the signal are identified and then compared against an internal or external time reference. This can either be an absolute time reference or a reference clock 124, as illustrated. The derived parameter portion of the display 122 in the illustrated example is a display of the interval error jitter. This is the difference between the period of the measured signal and the period of the reference clock edges 124. Thus, the vertical axis of the derived parameter plot 122 represents the comparison of these two signals or the signal of the primary measurement against an absolute time reference in different implementations.

Figure 11:
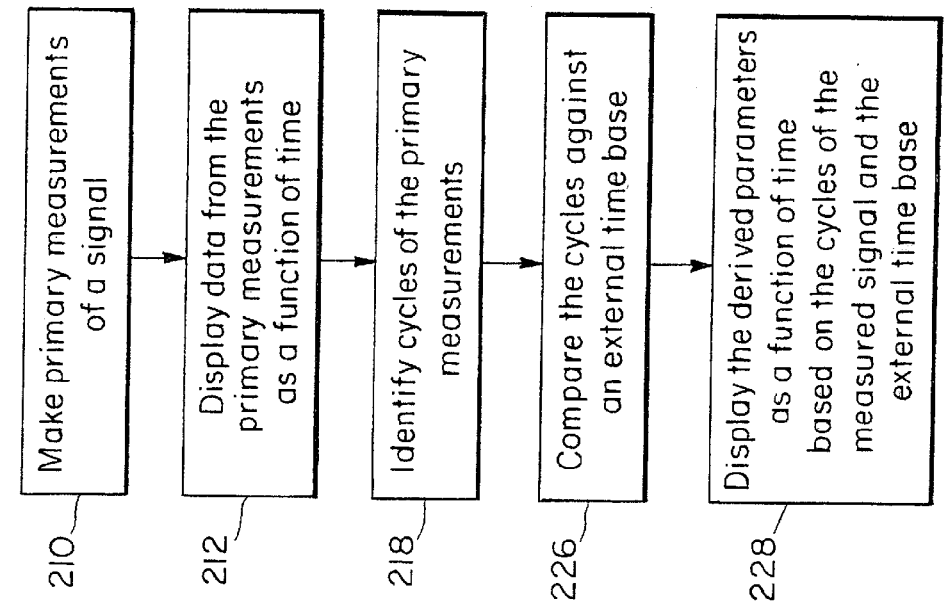
FIG. 11 is a process diagram illustrating the steps performed by the digital oscilloscope to generate time and cycle-based parameter displays.

FIG. 11 is a process diagram showing the method for generating the display as shown in FIG. 10. As in the process diagram of FIG. 9, the primary measurements are made, the data from the primary measurements is plotted and displayed, and cycles of the primary measurements of the signal is identified in steps 210, 212, and 218. Further, the cycles of the primary measurement are compared against an external time base in step 226. This can be an external clock source, or an absolute time reference either generated externally or within the oscilloscope. Then the derived parameters are plotted as a function of time. These derived parameters are based upon the comparison of the cycles of the signal and the time base in step 228.

In other implementations, the derived parameters can be based on the phase differences between the cycles of the signal and the absolute time reference, the timing errors between the cycles of the signal and the absolute time reference, phase differences between the cycles of the measured signal and the reference clock, and timing errors between the reference clock and the cycles of the measured signal.

Figure 12:
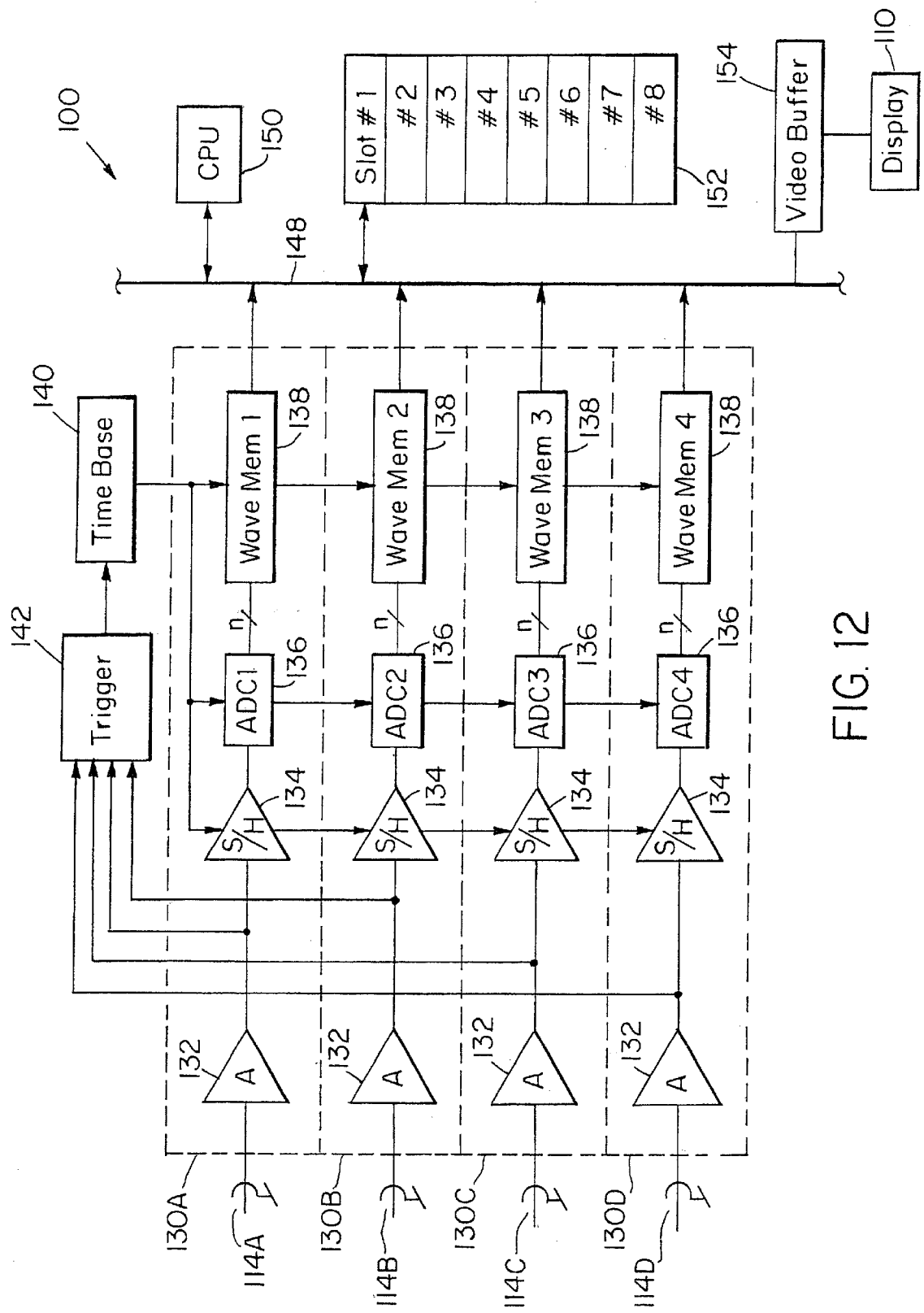
FIG. 12 is an block diagram illustrating the organization of an oscilloscope according to the present invention.

FIG. 12 is a block diagram showing the internal organization of the oscilloscope 100 of the present invention. Specifically, the four ports 114A–114B provide inputs to four parallel channels 130A–130D of the oscilloscope. Each channel 130 has an amplifier 132 for providing a high impedance input to the channel. The output to the amplifier goes to a sample-and-hold circuit 134 that temporarily freezes the signal for digitization by analog-to-digital converter ADC1–4 136. The digital output of the analog digital converters, 8 bits wide, in one embodiment, is stored to waveform memories 1–4 138. These waveform memories typically have from 1 to 16 million, eight bit deep, storage locations. Trigger 142 tracks the output from the amplifiers 132 of the channels 130A–130D to search for a trigger condition. When the trigger condition is found, the time base 140 is activated, which synchronizes the operation of the sample-and-hold circuits 134, analog digital converters 136, and waveform memories 138.

In one implementation, the sample-and-holds 134, analog-to-digital converters 138, and waveform memories 138 continuously freeze, digitize, and store the data that is descriptive of the voltage of the signals transmitted to ports 114A–114B by the probes when the trigger 142 is merely armed. The waveform memories 138 are addressed in the form of a circular buffer. Only after the trigger condition is found does the trigger 142 and time base 140 hold the contents of the waveform memory and thereby sample the waveform at the triggering event.

Central processing unit (CPU) 150 controls the overall operation of the oscilloscope 100. Specifically, data captured in the waveform memories 138 of the channels 130A–130B are transferred by the CPU 115 into slots in a local memory 152 via bus 148. In the preferred embodiment there are eight slots #1–#8 in the local memory 152. This allows the oscilloscope to save up to eight separate events captured by the waveform memories 138. For example, the four channels could be operated to simultaneously sample four signals. The CPU 150 transfers their contents to slots 1 through 4 of the local memory 152. Thereafter, the channels 130A–130B would be free to capture up to 4 more additional signal events, storing them in slots 5 through 8 of the local memory 152 before any overwriting is necessitated.

Under operator control, the CPU 150 selects the data in local memory slots 1 through 8 for processing and transfer to a video frame buffer 154. Specifically under operator control, the data in slots 1 and 5 could be selected for display. This data is then processed using non-linear interpolation techniques, sin(x)/x or cubic for example, and the resulting display data transferred to video buffer 154 which provides the data to display 110.

Figure 13:
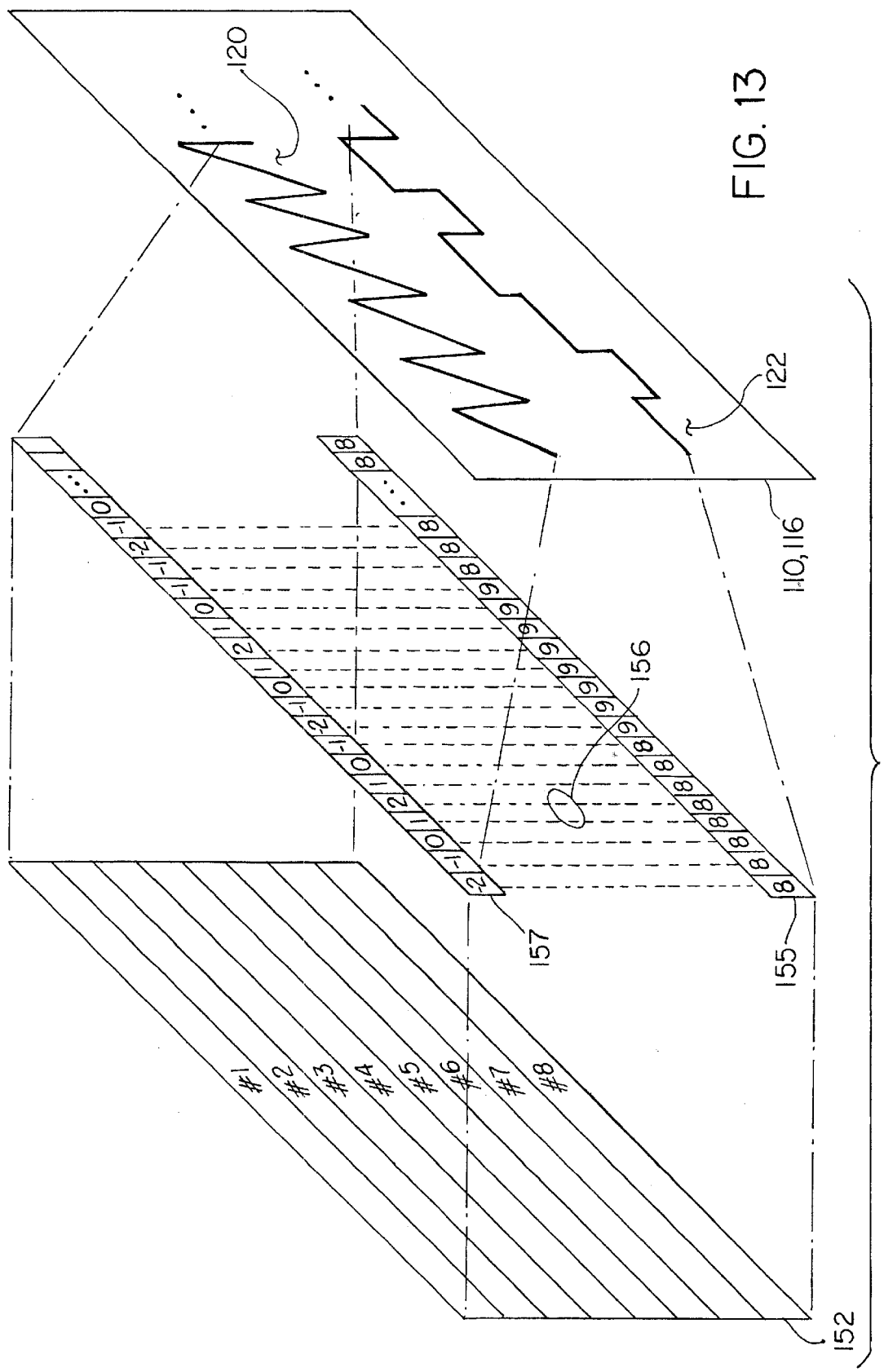
FIG. 13 is a block diagram showing the mapping of the arrays of the local memory to the display and the padding performed in the derived parameter array according to the present invention.

FIG. 13 is a schematic diagram illustrating the mapping of the data in the slots of the local memory 152 to the display 110. As the CPU 150 operates on the primary measurement data in any one of slots 1 through 8 in the local memory 152, the CPU stores the derived parameters back to a vacant slot. In this way, the derived parameters utilize a slot in the local memory 152 that could otherwise be used by the channels to perform another signal acquisition. Briefly, as described in reference to FIGS. 4 through 11, the CPU identifies cycles in the data of the primary measurements, thresholds the primary measurements possibly using non-linear interpolation to improve accuracy and hysteresis/low pass filtering for noise immunity, and/or other operations to generate the derived parameters.

One advantage of using the storage oscilloscope architecture is the fact that multiple parameters can be calculated from the same primary measurement data and stored for simultaneous display, for example. Moreover, parameter recalculation is possible where the original applied threshold, for example, used to generate the parameters is modified after observation of the parameter display.

FIG. 13 illustrates an example situation in which a triangular waveform is stored in slot 1, which was generated from signal acquisition. The data in the array of slot 1 is indicated by reference numeral 157. The second array from slot 7 is indicated by reference numeral 155 holding parameter derived from the data in array 157. In the illustrated example, the derived parameters relate to the period of the triangular signal stored in array 155 of slot 1. The dotted lines 156 extending between the two arrays illustrate that the data for the primary measurements and the derived parameters are stored with analogous temporal organizations. For example, array location n in the array 155 holds parameters derived from data in array location n in array 155.

In the preferred embodiment, array 155 holding the derived parameters is packed with the period-based data. Each location that corresponds to the same cycle of the primary measurements in array 154 holds the measure of the period in the derived parameter array. Although being somewhat wasteful in storage space, this allows the existing oscilloscope zoom and scan features to operate normally. Even when expanding or contracting the scale using normal oscilloscope functions, the horizontal axis of the primary measurement data and the derived parameters remain synchronized to a common time axis.

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for presenting information on a digital oscilloscope, the method comprising:
   making primary measurements of a signal;
   displaying data from the primary measurements as a function of time;
   calculating derived parameters from the data of the primary measurements; and
   displaying the derived parameters as a function of time with the data from the primary measurements, wherein the derived parameters are calculated and simultaneously displayed with the data from the primary measurements.

2. A method as described in claim 1, wherein the step of making the primary measurements of the signal comprises detecting a voltage of the signal at time intervals.

3. A method as described in claim 2, wherein the steps of displaying the primary measurement data and the derived parameters comprises plotting the detected voltages and derived parameters along a horizontal time axis.

4. A method as described in claim 1, further comprising displaying the derived parameters and the primary measurement data on a common display with a common time axis.

5. A method as described in claim 1, wherein the step of deriving the parameters comprises comparing the data from the primary measurements to a threshold.

6. A method as described in claim 5, wherein the step of deriving the parameters further comprises determining times for which the primary measurement data exceed the threshold.

7. A method as described in claim 5, wherein the step of deriving parameters further comprises determining times for which the primary measurement data fall below the threshold.

8. A method as described in claim 1, wherein the step of deriving the parameters comprises:
   identifying cycles in the signal; and
   calculating parameters for the cycles.

9. A method as described in claim 8, wherein the step of deriving the parameters further comprises determining the time between maxima and minima for each cycle.

10. A method as described in claim 8, wherein the step of deriving the parameters further comprises determining the time between minima and previous minima for each cycle.

11. A method as described in claim 8, wherein the step of deriving the parameters further comprises determining the time of a local minima for each cycle.

12. A method as described in claim 8, wherein the step of deriving the parameters further comprises determining the time of a local maxima for each cycle.

13. A method as described in claim 8, wherein the step of deriving the parameters further comprises determining the time between local maxima and local minima for each cycle.

14. A method as described in claim 8, wherein the step of deriving the parameters further comprises determining a period for each cycle.

15. A method as described in claim 8, wherein the step of deriving the parameters further comprises determining a frequency for each cycle.

16. A method as described in claim 8, wherein the step of deriving the parameters further comprises determining rise times for each cycle.

17. A method as described in claim 8, wherein the step of deriving the parameters further comprises determining fall times for each cycle.

18. A method as described in claim 8, wherein the step of deriving the parameters further comprises determining overshoot for each cycle.

19. A method as described in claim 8, wherein the step of deriving the parameters further comprises determining preshoot for each cycle.

20. A method as described in claim 8, wherein the step of deriving the parameters further comprises determining a change in period in cycles relative to adjacent cycles.

21. A method as described in claim 8, wherein the step of deriving the parameters further comprises determining a change in pulse width for cycles relative to adjacent cycles.

22. A method as described in claim 1, wherein the step of deriving the parameters comprises:
   identifying cycles in the signal; and
   comparing the primary measurements in each cycle to a threshold.

23. A method as described in claim 1, wherein the step of calculating the derived parameters comprises:
   identifying cycles in the signal; and
   comparing the primary measurement data to an absolute time reference.

24. A method as described in claim 1, wherein the step of deriving the parameters comprises comparing the primary measurements of the signal to a reference clock.

25. A method as described in claim 24, wherein the step of deriving the parameters further comprises determining phase differences between the reference clock and the cycles of the signal.

26. A method of operation for a digital oscilloscope, the method comprising:

repeatedly sampling and digitizing a signal at predetermined time intervals and storing data generated by the digitization;

deriving parameters as a function of time from the data of the primary measurements; and displaying the derived parameters as a function of time, wherein the derived parameters are calculated and simultaneously displayed with the data from the primary measurements.

27. A method as described in claim 26, wherein the step of sampling and digitizing the signal comprises detecting a voltage of the signal.

28. A method as described in claim 27, wherein the step of displaying the parameters comprises plotting the parameters along an horizontal time axis of a display.

29. A method as described in claim 28, further comprising displaying the parameters with the data from the digitization on a common display with a common time axis.

30. A digital oscilloscope, comprising:

at least one digitization channel that performs primary measurements of a signal and generates data indicative of the measurements;

a data processing unit that derives parameters as a function of time from the primary measurement data; and a display on which the data from the primary measurements and the derived parameters are plotted as a function of time, wherein the derived parameters are calculated and simultaneously displayed with the data from the primary measurements.

31. A digital oscilloscope as described in claim 30, further comprising at least four digitization channels.

32. A digital oscilloscope as described in claim 30, wherein the at least one digitization channel comprises:

a sample-and-hold circuit that freezes the signal;

an analog-to-digital converter that digitizes the signal from the sample-and-hold circuit; and a waveform memory that stores the digital data generated by the analog-to-digital converter.

33. A digital oscilloscope as described in claim 30, wherein the data processing unit controls the display to plot the data from the primary measurements and the derived parameters along an horizontal time axis.

34. A digital oscilloscope as described in claim 30, wherein the data processing unit controls the display to plot the derived parameters and the data from the primary measurements with a common time axis.

35. A method for presenting information on a digital oscilloscope, the method comprising:

making primary measurements of a signal;

displaying data from the primary measurements as a function of time;

multiple arrays of different parameters from the data of the primary measurements; and calculating and simultaneously displaying the different derived parameters as a function of time with the data from the primary measurements.

36. A method for presenting information on a digital oscilloscope, the method comprising:

making primary measurements of a signal;

displaying data from the primary measurements as a function of time;

deriving parameters from the data of the primary measurements; and calculating and simultaneously displaying the derived parameters as a function of time with the data from the primary measurements;

recalculating the parameter based on new criteria after observing the display of the parameters.

* * * * *